United States Patent
Korta et al.

(10) Patent No.: US 12,396,144 B2
(45) Date of Patent: Aug. 19, 2025

(54) INLET AND OUTLET CHANNELS FOR A HEAT EXCHANGER

(71) Applicant: Aptiv Technologies AG, Schaffhausen (CH)

(72) Inventors: Jakub Antoni Korta, Cracow (PL); Tomasz Dolot, Cracow (PL)

(73) Assignee: Aptiv Technologies AG, Schaffhausen (CH)

( * ) Notice: Subject to any disclaimer, the term of this patent is extended or adjusted under 35 U.S.C. 154(b) by 265 days.

(21) Appl. No.: 18/151,647

(22) Filed: Jan. 9, 2023

(65) Prior Publication Data
US 2023/0269916 A1 Aug. 24, 2023

Related U.S. Application Data

(60) Provisional application No. 63/268,261, filed on Feb. 18, 2022.

(51) Int. Cl.
*F28F 9/02* (2006.01)
*F28F 3/12* (2006.01)
(Continued)

(52) U.S. Cl.
CPC ........... *H05K 7/20872* (2013.01); *F28F 3/12* (2013.01); *F28F 9/0256* (2013.01); *F28F 9/26* (2013.01);
(Continued)

(58) Field of Classification Search
CPC ... F28D 1/03; F28F 3/12; F28F 9/0248; F28F 9/0256; F28F 9/26; F28F 21/065;
(Continued)

(56) References Cited

U.S. PATENT DOCUMENTS 4,258,785 A * 3/1981 Beldam ................. F28D 1/0333
165/DIG. 465
4,967,834 A * 11/1990 Tokizaki ............... F28F 9/0246
165/175

(Continued)

FOREIGN PATENT DOCUMENTS

FR 2719110 A1 10/1995
GB 2586058 A 2/2021

(Continued)

OTHER PUBLICATIONS

"European Search Report", EP Application No. 23155627, Jun. 30, 2023, 2 pages.

*Primary Examiner* — Eric S Ruppert
*Assistant Examiner* — Hans R Weiland
(74) *Attorney, Agent, or Firm* — Harness, Dickey & Pierce, P.L.C.

(57) ABSTRACT

A manifold of a cooling system includes an inlet channel and an outlet channel designed to connect to multiple plates of a heat exchanger. The inlet and outlet channels include a junction portion, a connection portion, and a transfer portion. The junction portion includes opposing inclined contact surfaces that are inclined relative to a horizontal plane of the plates and mate with corresponding inclined contact surfaces of the plates. The connection portion accepts coolant hoses. The transfer portion is located between the junction portion and connection portions.

20 Claims, 8 Drawing Sheets

(51) Int. Cl.
*F28F 9/26* (2006.01)
*H05K 7/20* (2006.01)
*F28F 21/06* (2006.01)

(52) U.S. Cl.
CPC ....... *F28F 21/065* (2013.01); *F28F 2275/025* (2013.01); *F28F 2275/08* (2013.01)

(58) Field of Classification Search
CPC ............. F28F 2275/025; F28F 2275/08; F28F 2275/14; F28F 2230/00; F28F 2280/04; H05K 7/20872
See application file for complete search history.

(56) References Cited

U.S. PATENT DOCUMENTS

| | | | | |
|---|---|---|---|---|
| 5,125,453 | A | * | 6/1992 | Bertrand ............... F28D 1/0341 165/DIG. 466 |
| 2004/0177950 | A1 | | 9/2004 | Gluck |
| 2016/0245597 | A1 | | 8/2016 | Meshenky et al. |

FOREIGN PATENT DOCUMENTS

| | | | |
|---|---|---|---|
| JP | S62268988 A | * | 11/1987 |
| JP | H06194001 A | * | 7/1994 |
| JP | 3911574 B2 | | 5/2007 |

\* cited by examiner

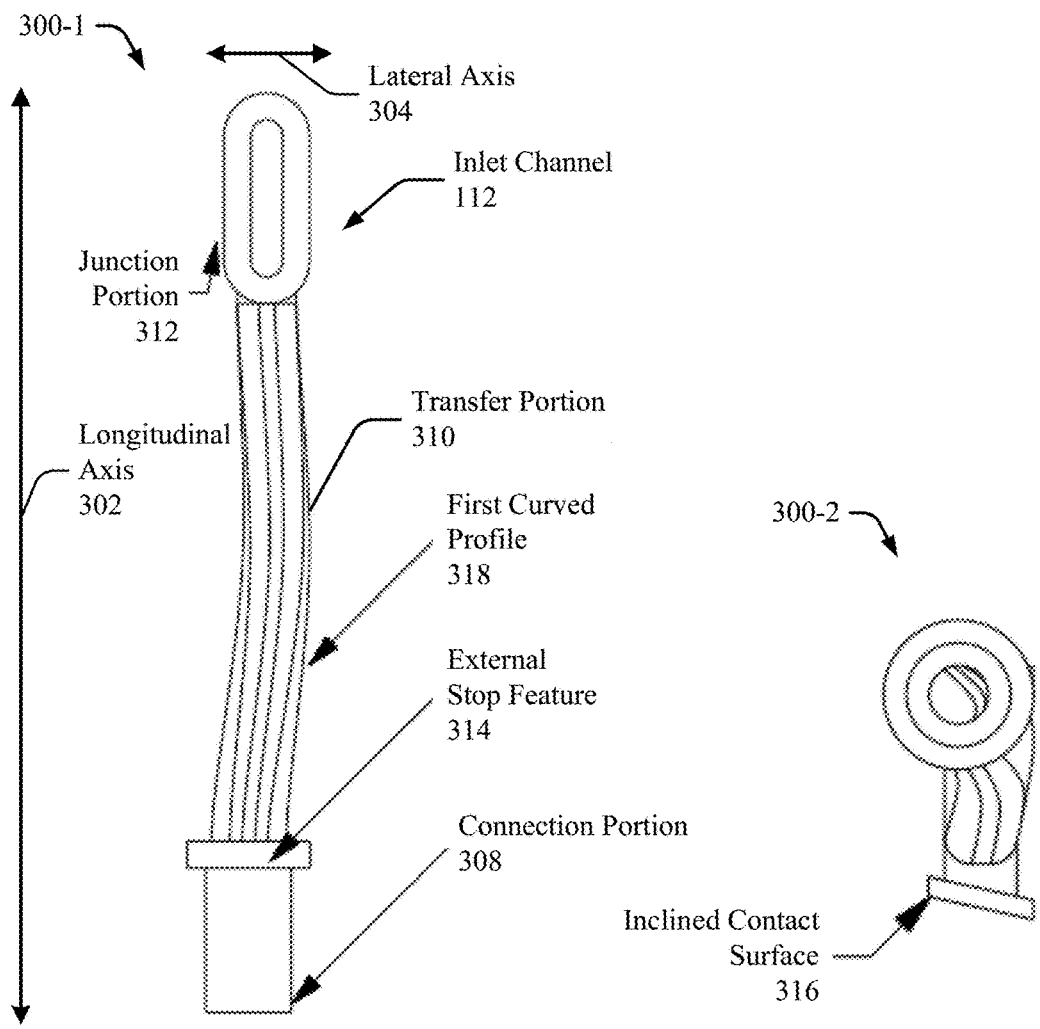
*FIG. 3A*
*FIG. 3B*
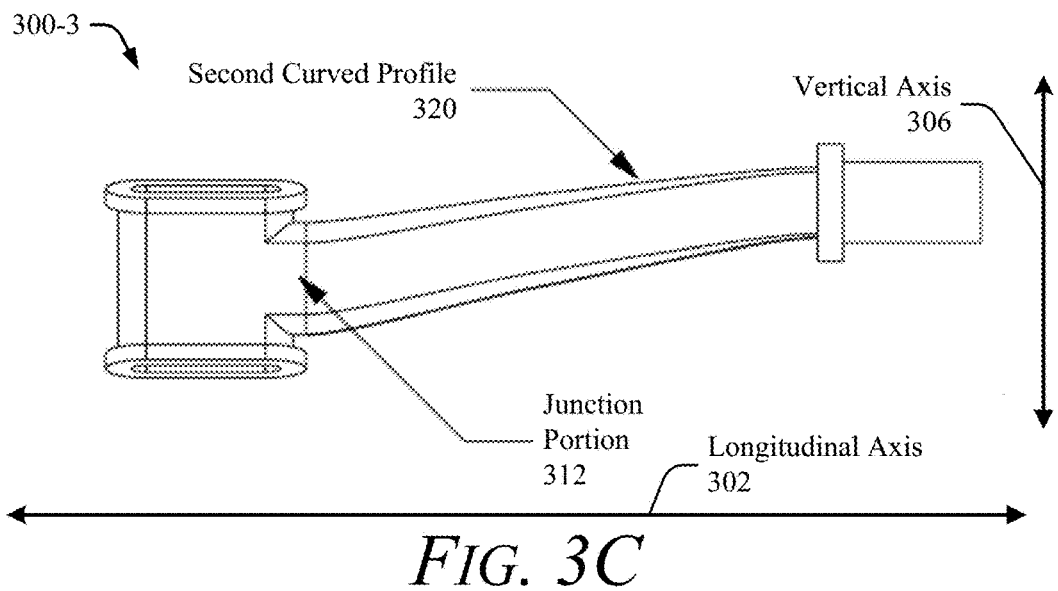
*FIG. 3C*

INLET AND OUTLET CHANNELS FOR A HEAT EXCHANGER

CROSS-REFERENCE TO RELATED APPLICATION

This application claims the benefit of U.S. Provisional Application No. 63/268,261, filed Feb. 18, 2022, the disclosure of which is incorporated by reference herein in its entirety.

TECHNICAL FIELD

The present disclosure concerns a manifold for a cooling system. The present disclosure is particularly relevant for inlet and outlet channels for heat exchangers in automobiles.

BACKGROUND

The growth in the performance of automotive electronics has caused an increase in the sophistication of electronic systems in vehicles. For example, traditional electronic control units (ECUs) are being replaced by domain control units (DCUs) that are designed to control multiple functionalities within a selected domain (e.g., advanced driver assistance systems (ADAS) or infotainment domains). This growth in the performance and number of control units has led to requirements for more efficient cooling means to keep their operating temperatures within safe operating limits. Vehicles often use liquid cooling systems through heat exchangers (e.g., plate heat exchangers) to dissipate excessive thermal energy away efficiently and safely from the control units. However, such heat exchangers must be designed to accommodate tight assembly spaces in vehicles and ensure even coolant distribution among individual portions of the heat exchanger to provide even heat distribution away from the control units.

SUMMARY

This document describes inlet and outlet channels of a manifold to connect to a heat exchanger that provides a compact profile with consistent cooling performances among the heat exchanger plates. The described inlet and outlet channels are especially useful for automotive applications that generally have tight assembly spaces. For example, a manifold of a cooling system includes an inlet channel and an outlet channel designed to connect to a heat exchanger with multiple plates. The inlet channel and the outlet channel include a junction portion, a connection portion, and a transfer portion. The junction portion transfers coolant to and from each plate and includes opposing inclined contact surfaces that are inclined relative to a horizontal plane of the plates. The inclined contact surfaces mate with corresponding inclined contact surfaces of the plates of the heat exchanger. The connection portion accepts coolant hoses. The transfer portion is located between the junction portion and the connection portion.

This Summary introduces concepts related to inlet and outlet channels of a heat exchanger, further described in the Detailed Description and Drawings. This Summary is not intended to identify essential features of the claimed subject matter, nor is it intended to determine the scope of the claimed subject matter.

BRIEF DESCRIPTION OF THE DRAWINGS

Exemplified embodiments of inlet and outlet channels for a heat exchanger are described in this document with reference to the following figures. The same numbers may be used throughout the drawings to reference like features and components:

FIGS. 3A through 3C illustrate a top view, front view, and side view of an exemplified inlet channel of the heat exchanger;

DETAILED DESCRIPTION

Liquid cooling systems provide an efficient means to dissipate heat produced by electronics in vehicles. Such cooling systems may include heat exchangers that guide the liquid coolant to flow over or under a region of high temperature to absorb excessive thermal energy produced by electronic components (e.g., ECUs, DCUs) and transfer it to another region of the vehicle or the ambient environment.

One type of heat exchanger used in automotive applications with liquid cooling systems is a plate heat exchanger. A plate heat exchanger includes large, flat cooling surfaces (e.g., cold plates) that allow the heat from the electronic components to be efficiently transferred to the coolant. Existing heat exchanger systems, especially those with multiple cold plates, may have difficulty in providing uniform cooling performance among the cold plates due to uneven coolant flow among the cold plates. In addition, these systems may require excessive space for attached hoses and manifolds and may not fit within the tight spacing constraints of many vehicles.

In contrast, this document describes techniques and systems to provide inlet and outlet channels of a manifold for heat exchangers that provide uniform cooling performance within the plates of a heat exchanger and provide a thin profile to save space for assembly within a vehicle. For example, the manifold includes inlet and outlet channels positioned in between multiple plates to allow for an even flow of coolant among the plates. In addition, the inlet and outlet channels are separated from the overall design of the heat exchanger, allowing these components to be designed with different materials and manufactured separately. This example is just one exemplified embodiment of the described inlet and outlet channels for heat exchangers. This document describes other exemplified embodiments and implementations.

Figure 1:
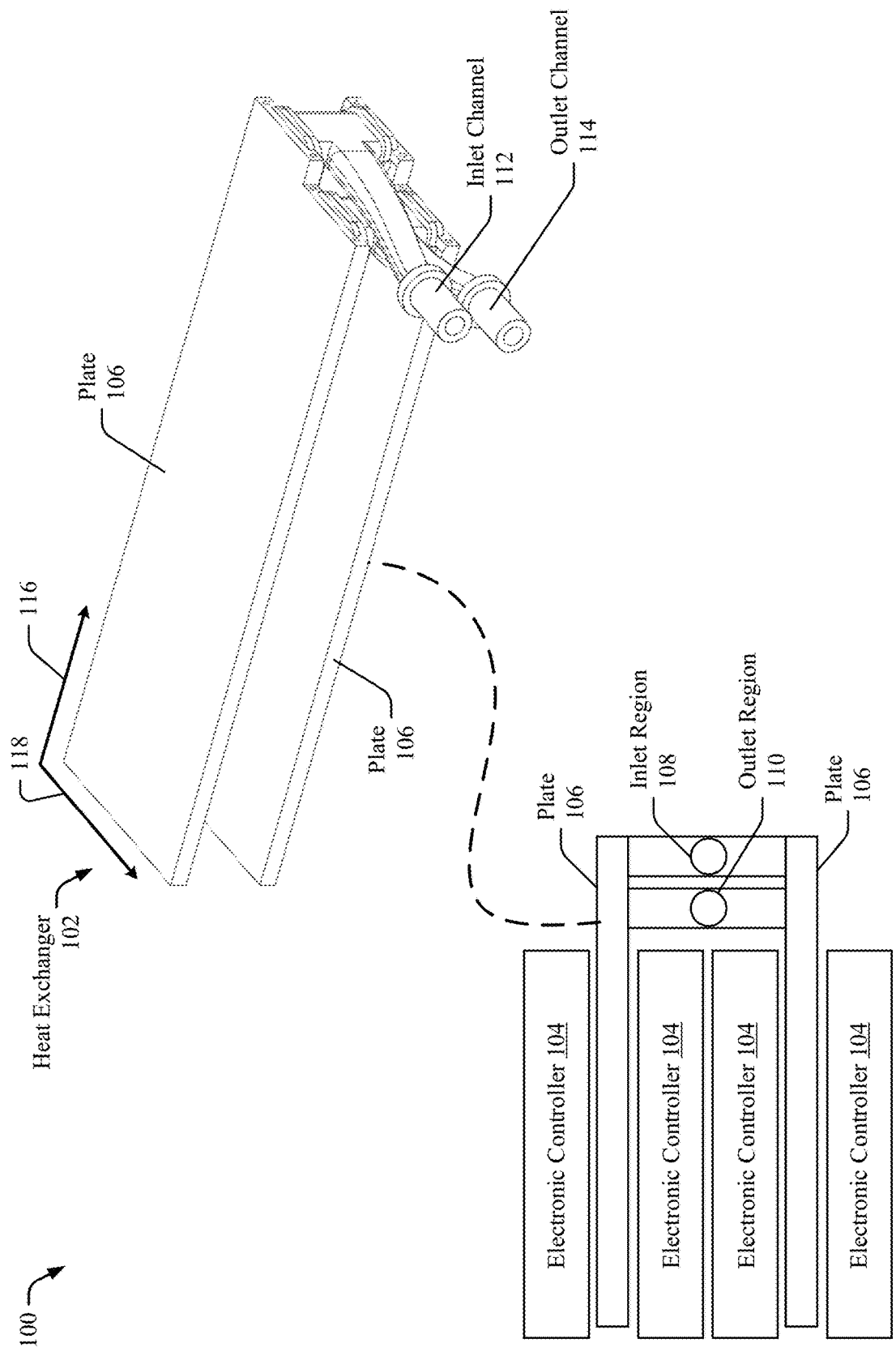
FIG. 1 illustrates an exemplified cooling system in which inlet and outlet channels for heat exchanger are implemented.

FIG. 1 illustrates an exemplified cooling system 100 in which inlet and outlet channels for a heat exchanger are implemented. In the depicted cooling system 100, a heat exchanger 102 is attached to or positioned near multiple electronic controllers 104 (e.g., DCUs, ECUs, systems-on-chip (SoCs)).

The electronic controllers 104 may control the operations and functionalities of a vehicle (not illustrated). For example, a first electronic controller 104 may control advanced driver assistance systems (ADAS). A second electronic controller 104 may control the navigation and entertainment functionalities of the vehicle. The depicted cooling system 100 includes four electronic controllers 104. In other implementations, the cooling system 100 may include fewer or additional electronic controllers 104.

The heat exchanger 102 cools the electronic controllers 104 using a liquid cooling system. The heat exchanger 102 includes multiple plates 106 with an inlet region 108 and an outlet region 110 positioned between the plates 106. An inlet channel 112 and an outlet channel 114 are connected to the inlet region 108 and the outlet region 110, respectively. In other implementations, the positioning of the inlet region 108 and the outlet region 110 may be switched. By positioning the inlet region 108 and the outlet region 110 in between the plates 106, the heat exchanger 102 has a smaller profile and minimizes space for assembly within the vehicle.

The plate 106 acts as a cooling surface to transfer heat from one or more electronic controllers 104 to the ambient environment via liquid coolant (e.g., water) circulating through the heat exchanger 102. The plates 106 are generally flat and planar and may be sized to have a surface area approximately equal to the surface area of the electronic controllers 104. A lateral axis 116 and a longitudinal axis 118 define a horizontal plane of the plates 106. The relatively large and flat surface area of the plates 106 allows heat to be efficiently transferred from the electronic controllers 104 to the liquid coolant.

In the depicted cooling system 100, the heat exchanger 102 includes two plates 106 positioned in between four electronic controllers 104, with an electronic controller 104 positioned above and below each plate 106. In other implementations, the cooling system 100 may include a different number and arrangement of electronic controllers 104 and plates 106. For example, the cooling system 100 may include a single heat exchanger 102 with four plates 106 positioned between eight electronic controllers 104. In another exemplified embodiment, the cooling system 100 may including a heat exchanger 102 with a single plate 106.

The cooling system 100 introduces the coolant to the heat exchanger 102 via the inlet channel 112. The inlet channel 112 is designed to divide the liquid coolant between plates 106 equally. In this way, an equal volume ratio of liquid coolant is guided to each plate 106. After circulating inside the plates 106, the coolant is directed toward the outlet channel 114.

As described in greater detail below, the inlet channel 112 and the outlet channel 114 are designed to provide a heat exchanger 102 with a compact design. This compact design is advantageous for some vehicles' relatively tight assembly spaces. The inlet channel 112 and outlet channel 114 also provide equal coolant circulation among the plates 106, resulting in uniform cooling performance for the cooling system 100.

The inlet channel 112 and outlet channel 114 are also separate components from the heat exchanger 102, which simplifies the design of the cooling system 100 and the heat exchanger 102. The use of individual components also allows the heat exchanger 102 and the plates 106 to be manufactured separately and by different means than the inlet channel 112 and the outlet channel 114. In this way, the plates 106 may be manufactured from different material than the inlet channel 112 and the outlet channel 114. For example, the plates 106 are metal (e.g., aluminum alloy) or another thermally conductive material. The inlet channel 112 and outlet channel 114 are a plastic material (e.g., Polyamide 66 (PA66) or reinforced plastic with glass fibers). As a result, the inlet channel 112 and the outlet channel 114 are manufactured with cheaper and lighter material resulting in cost and weight savings for the cooling system 100.

Figure 2A:
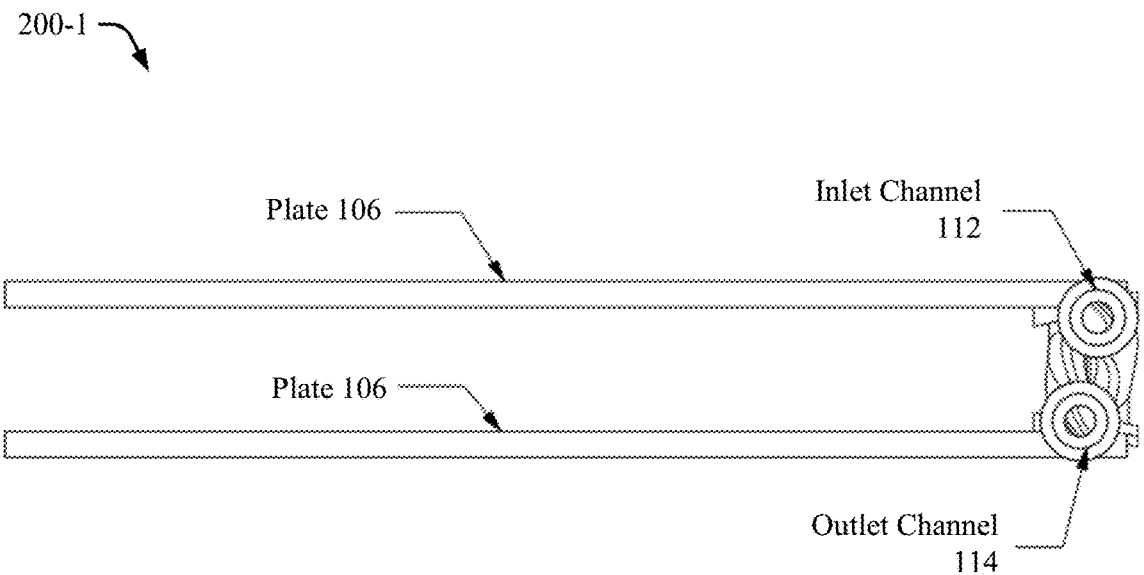
FIGS. 2A and 2B illustrate a side view and top view of an exemplified cooling system with a heat exchanger and the described inlet channel and outlet channel.
Figure 2B:
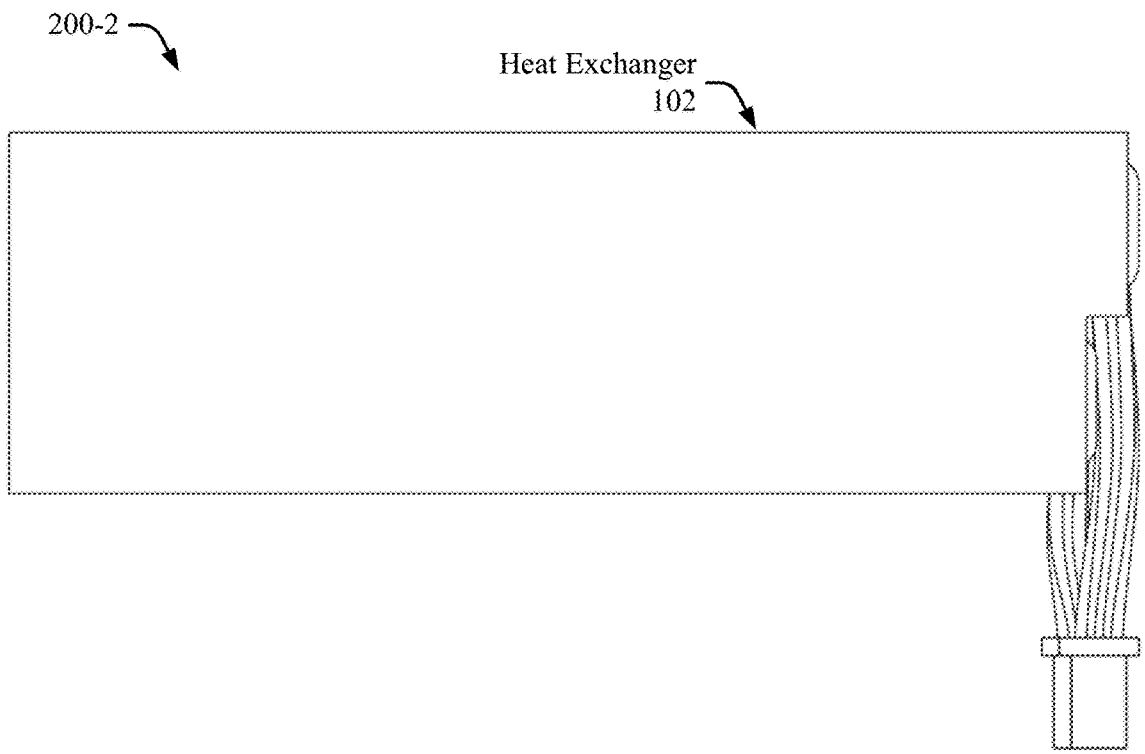

FIGS. 2A and 2B illustrate a side view 200-1 and top view 200-2 of an exemplified cooling system with a heat exchanger and the described inlet channel 112 and outlet channel 114. The cooling system and heat exchanger of FIGS. 2A and 2B may be the cooling system 100 and the heat exchanger 102 of FIG. 1, respectively.

As illustrated in the side view 200-1 of FIG. 2A, the heat exchanger 102 includes a plate 106 (e.g., an upper plate) positioned above another plate 106 (e.g., a lower plate). The inlet channel 112 and the outlet channel 114 extend laterally away from the plates 106 to provide the heat exchanger 102 with a thin profile in a first dimension (e.g., vertical direction). As illustrated in the top view 200-2 of FIG. 2B, the inlet channel 112 and the outlet channel 114 extend approximately straight from the plates 106 to provide the heat exchanger 102 with a thin profile in a second dimension (e.g., lateral direction). In this way, the heat exchanger 102 fits within the tight assembly space of many vehicles.

FIGS. 3A through 3C illustrate a top view 300-1, front view 300-2, and side view 300-3 of an exemplified inlet channel 112 of the heat exchanger 102. In other implementations, the inlet channel 112 of FIGS. 3A through 3C may act as the outlet channel 114 of the cooling system 100. The top view 300-1 depicts a longitudinal axis 302 extending from a connection portion 308 to a junction portion 312 of the inlet channel 112. The inlet channel 112 also includes a transfer portion 310 extending along the longitudinal axis 302 and located between the connection portion 308 and the junction portion 312. The top view 300-1 also depicts a lateral axis 304 perpendicular to the longitudinal axis 302. The side view 300-3 illustrates a vertical axis 306 perpendicular to the longitudinal axis 302. The transfer portion 310 may include non-uniform cross-sections along the longitudinal axis 302. For example, proximate the connection portion 308, the transfer portion 310 may have an approximately circular cross-section. Proximate the junction portion 312, the transfer portion 310 may have an approximately rectangular cross-section.

The connection portion 308 may have an approximately circular cross-section. The circular connection portion 308 is adapted to accept a coolant hose. Automotive cooling systems often use hoses to transport liquid coolant in and out of the heat exchanger 102. For example, the hoses are flexible rubber hoses. A hose may be attached to the connection portion 308 using a clamp or similar attachment means. The connection portion 308 also includes an external stop feature 314 that prevents the hose from sliding along the longitudinal axis 302 onto or into the transfer portion 310.

The junction portion 312 may have an approximately rectangular cross-section in both the top view 300-1 and the side view 300-3. The junction portion 312 of the inlet channel 112 transfers the coolant towards the plates 106. In the depicted implementation, the inlet channel 112 attaches to two plates 106 and the junction portion 312 is a T-junction that equally distributes the coolant to both plates 106. The approximately rectangular cross-section of the junction portion 312 provides a compact design to minimize the assembly space used by the heat exchanger 102.

The junction portion 312 also includes an inclined contact surface 316 at opposing surfaces. In particular, the inclined contact surfaces 316 are inclined relative to a horizontal plane of the plates 106 defined by the lateral axis 116 and the longitudinal axis 118. The inclined contact surfaces 316 of the junction portion 312 are not parallel to one another and incline vertically toward a vertical center of the junction portion 312 along the vertical axis 306. The inclined contact surfaces 316 mate with or abut corresponding inclined contact surfaces of the plates 106 when the heat exchanger 102 is assembled. As described in greater detail with respect to FIG. 7, the junction portion 312 and the inclined contact surfaces 316 are adapted for a single-move assembly process of the heat exchanger 102 that allows the inlet channel 112 to be assembled to the plates 106 of the heat exchanger 102 along the longitudinal axis 302. The inclined surfaces 316 allow the inlet channel 112 to be assembled to the plates 106 from the front or side along the horizontal plane of the plates 106, which may be necessary due to space limitations.

The transfer portion 310 includes a first curved profile 318 and a second curved profile 320 to minimize the assembly space used by the heat exchanger 102, which is described in greater detail with respect to FIGS. 6A through 6D. The first curved profile 318 introduces a small bend or curve to the right in the inlet channel 112 as it transitions from the connection portion 308 to the junction portion 312. In other implementations, the first curved profile 318 may result in a left curve in the transfer portion 310. The first curved profile 318 is present in a plane defined by the longitudinal axis 302 and the lateral axis 304.

The second curved profile 320 introduces a small bend or curve downward in the inlet channel 112 as it transitions from the connection portion 308 to the junction portion 312. In other implementations, the second curved profile 320 may result in an upward curve in the transfer portion 310. The second curved profile 320 is present in a plane defined by the longitudinal axis 302 and the vertical axis 306.

Figures 4A, 4B:
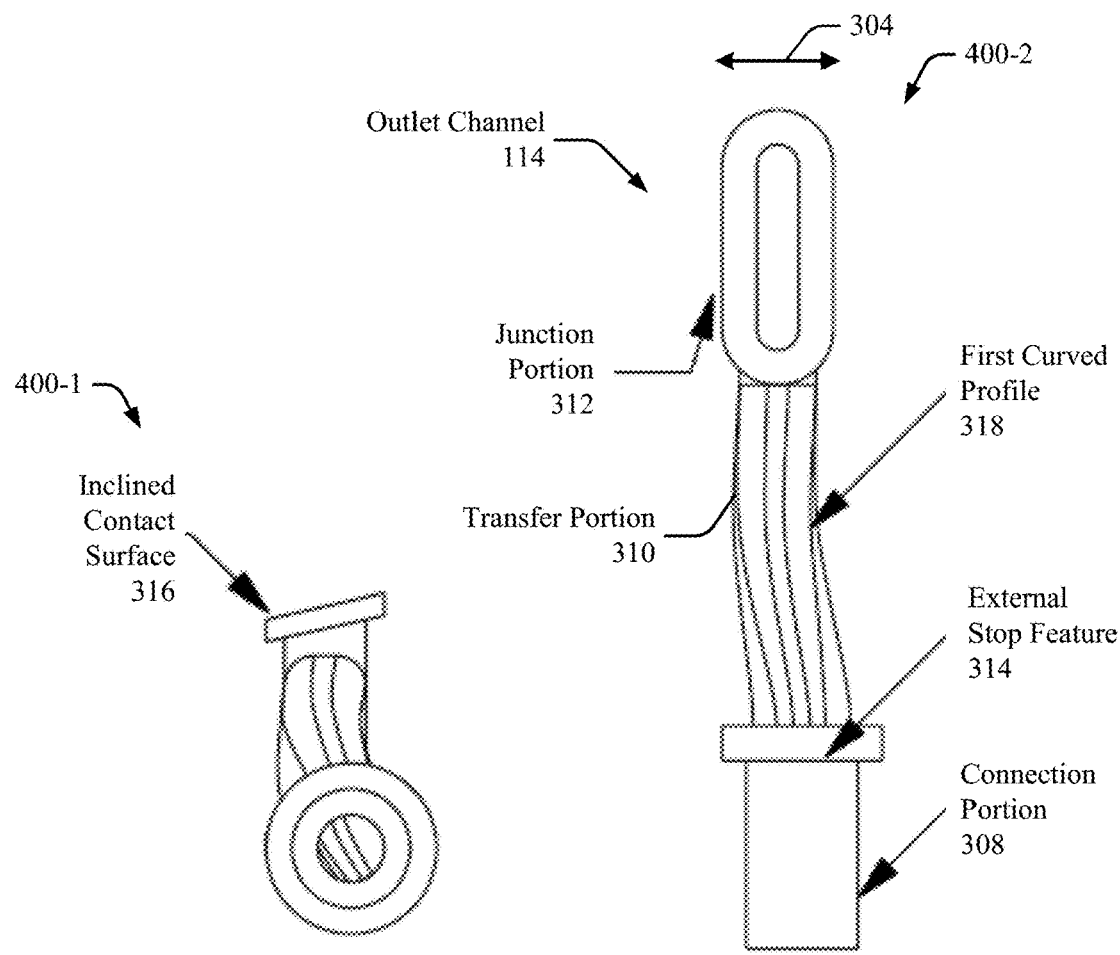
FIGS. 4A through 4C illustrate a top view, front view, and side view of an exemplified outlet channel of the heat exchanger.
Figure 4C:
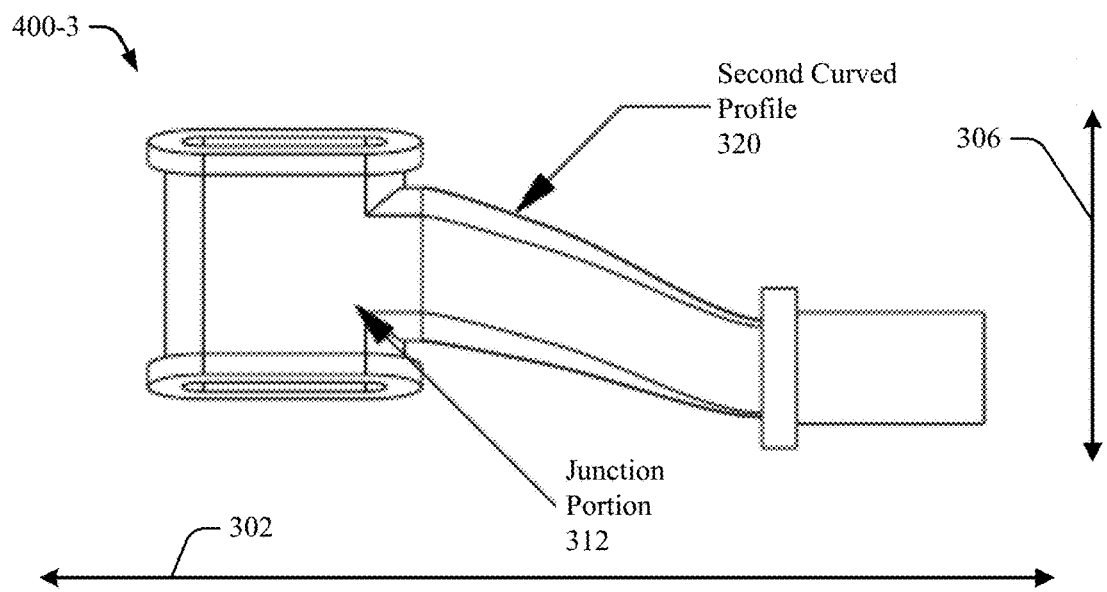
Figure 5A:
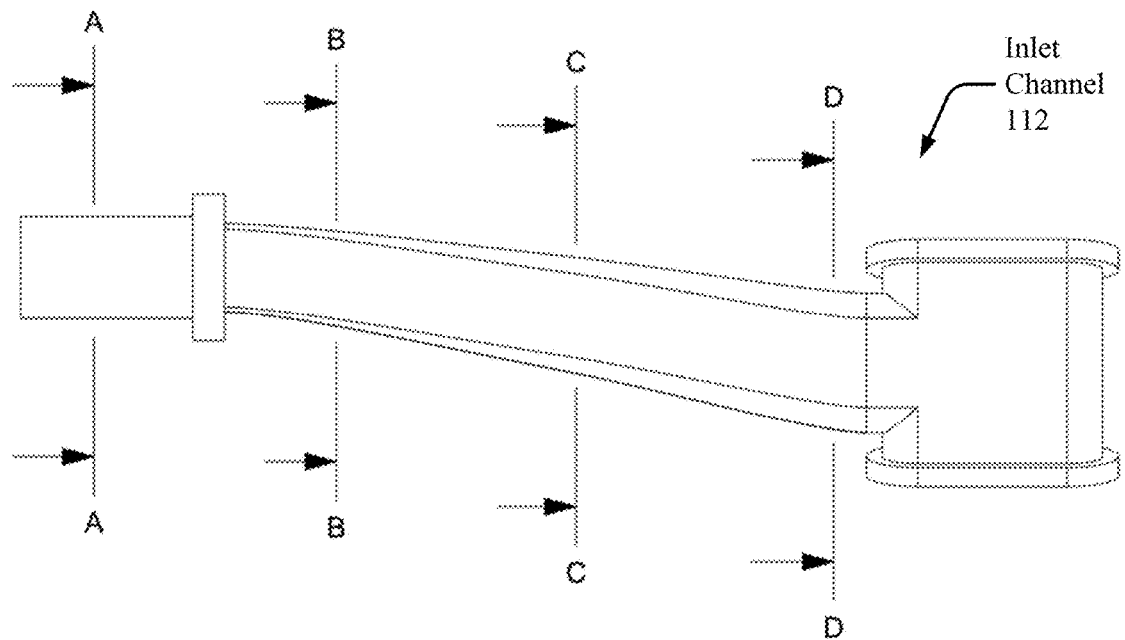
FIGS. 5A through 5E illustrate exemplified cross-sections of the connection portion and the transfer portion of the inlet channel.
Figures 5B, 5C, 5D, 5E:
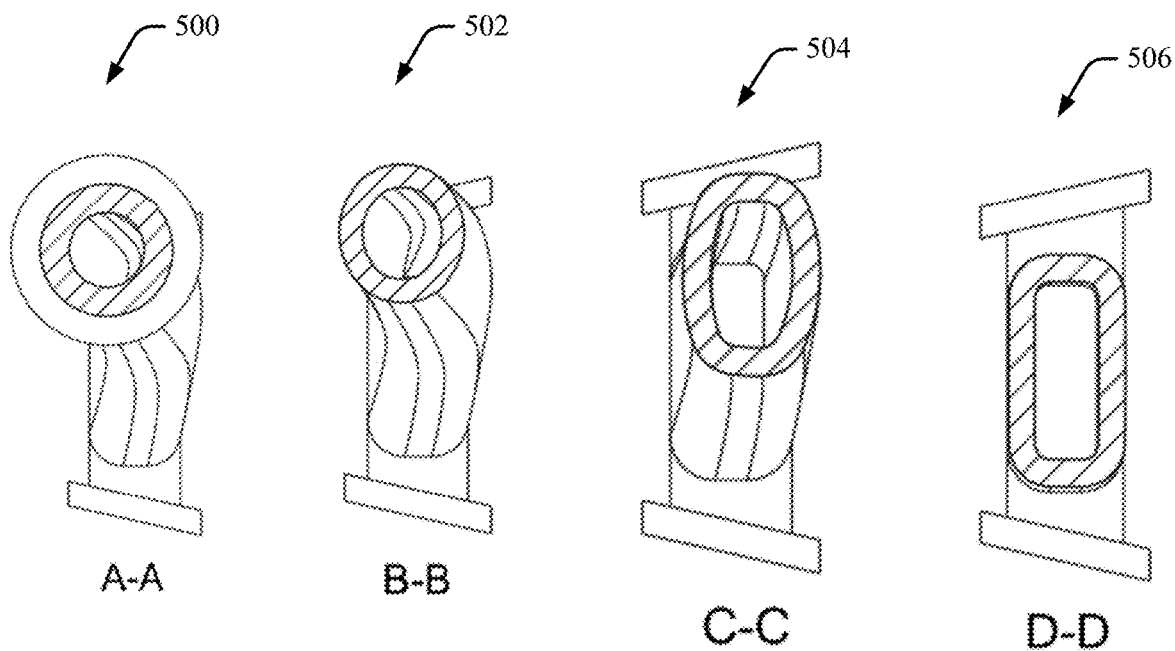

FIGS. 4A through 4C illustrate a front view 400-1, top view 400-2, and side view 400-3 of an exemplified outlet channel 114 of the heat exchanger 102. In other implementations, the outlet channel 114 of FIGS. 4A through 4C may act as the inlet channel 112 of the cooling system 100. The side view 400-3 depicts the longitudinal axis 302 extending from the connection portion 308 to the junction portion 312 of the outlet channel 114. The side view 400-3 also illustrates the vertical axis 306. The top view 300-1 shows the lateral axis 304.

The outlet channel 114 of FIGS. 4A through 4C is similar to the inlet channel 112 of FIGS. 3A through 3C. The outlet channel 114 includes the connection portion 308, the transfer portion 310, and the junction portion 312. The transfer portion 310 may include non-uniform cross-sections along the longitudinal axis 302. For example, proximate the connection portion 308, the transfer portion 310 may have an approximately circular cross-section. Proximate the junction portion 312, the transfer portion 310 may have an approximately rectangular cross-section.

The connection portion 308 may have an approximately circular cross-section. The circular connection portion 308 is adapted to accept a coolant hose. Automotive cooling systems often use hoses to transport liquid coolant in and out of the heat exchanger 102. For example, the hoses may be flexible rubber hoses. A hose may be attached to the connection portion 308 using a clamp or similar attachment means. The connection portion 308 also includes the external stop feature 314 that prevents the hose from sliding along the longitudinal axis 302 onto or into the transfer portion 310.

The junction portion 312 may have an approximately rectangular cross-section in both the top view 400-2 and the side view 400-3. The junction portion 312 of the outlet channel 114 transfers the coolant away from the plates 106. In the depicted implementation, the outlet channel 114 attaches to two plates 106 and the junction portion 312 is a T-junction that equally distributes the coolant away from both plates 106. The approximately rectangular cross-section of the junction portion 312 provides a compact design to minimize the assembly space used by the heat exchanger 102.

The junction portion 312 also includes the inclined contact surface 316 at opposing surfaces. In particular, the inclined surfaces 316 are inclined relative to a horizontal plane of the plates 106 defined by the lateral axis 116 and the longitudinal axis 118. The inclined contact surfaces 316 of the junction portion 312 are not parallel to one another and incline vertically toward a vertical center of the junction portion 312 along the vertical axis 306. The inclined contact surfaces 316 mate with or abut corresponding inclined contact surfaces of the plates 106 when the heat exchanger 102 is assembled. As described in greater detail with respect to FIG. 7, the junction portion 312 and the inclined contact surfaces 316 are adapted for a single-move assembly process of the heat exchanger 102 that allows the outlet channel 114 to be assembled to the plates 106 of the heat exchanger 102 along the longitudinal axis 302. The inclined surfaces 316 allow the outlet channel 114 to be assembled to the plates 106 from the front or side along the horizontal plane of the plates 106, which may be necessary due to space limitations.

The transfer portion 310 includes the first curved profile 318 and the second curved profile 320 to minimize the assembly space used by the heat exchanger 102, which is described in greater detail with respect to FIGS. 6A through 6D. The first curved profile 318 introduces a small bend or curve to the left in the outlet channel 114 as it transitions from the connection portion 308 to the junction portion 312. In other implementations, the first curved profile 318 may result in a right curve in the transfer portion 310. The first curved profile 318 is present in a plane defined by the longitudinal axis 302 and the lateral axis 304.

The second curved profile 320 introduces a small bend or curve upward in the outlet channel 114 as it transitions from the connection portion 308 to the junction portion 312. In other implementations, the second curved profile 320 results in a downward curve in the transfer portion 310. The second curved profile 320 is present in a plane defined by the longitudinal axis 302 and the vertical axis 306.

FIGS. 5A through 5E illustrate exemplified cross-sections 500, 502, 504, and 506 of the connection portion 308 and the transfer portion 310 of the inlet channel 112. The outlet channel 114 has similar cross-sections as the inlet channel 112. As illustrated by the cross-sections 500 through 506, the transfer portion 310 has a non-uniform cross-section along the longitudinal axis 302. In particular, the inlet channel 112 transitions from a first cross-section (e.g., an approximately circular cross-section as illustrated by the cross-sections 500 and 502 of FIGS. 5B and 5C) to a second cross-section (e.g., an approximately rectangular cross-section as illustrated by the cross-sections 504 and 506 of FIGS. 5D and 5E). The first cross-section of the connection portion 308 is adapted for attaching coolant hoses (e.g., rubber hoses) to guide the coolant towards and away from the heat exchanger 102. The second cross-section of the transfer portion 310 and the junction portion 312 allows for the compact design of the heat exchanger 102.

FIGS. 6A through 6D illustrate a perspective view 600, front view 602, side view 604, and cross-section view 606, respectively, of an exemplified inlet channel 112 and an exemplified outlet channel 114 in assembly positions. As described above, the transfer portion 310 of both the inlet channel and the outlet channel 114 includes the first curved profile 318 and the second curved profile 320. In the depicted implementation, the first curved profile 318 of the inlet channel 112 is a bend to the right while the first curved profile 318 of the outlet channel 114 is a bend to the left along the longitudinal axis 302 from the connection portion 308 to the junction portion 312. In other implementations, the first curved profile 318 of the inlet channel 112 and the outlet channel 114 may be switched. The first curved profile 318 allows the connection portion 308 of the inlet channel 112 to be positioned at approximately the same lateral position as the connection portion 308 of the outlet channel 114, as illustrated in the front view 602 of FIG. 6B. In this way, the connection portions 308 of the heat exchanger 102 use a limited lateral assembly space for the coolant hoses.

Figure 6A:
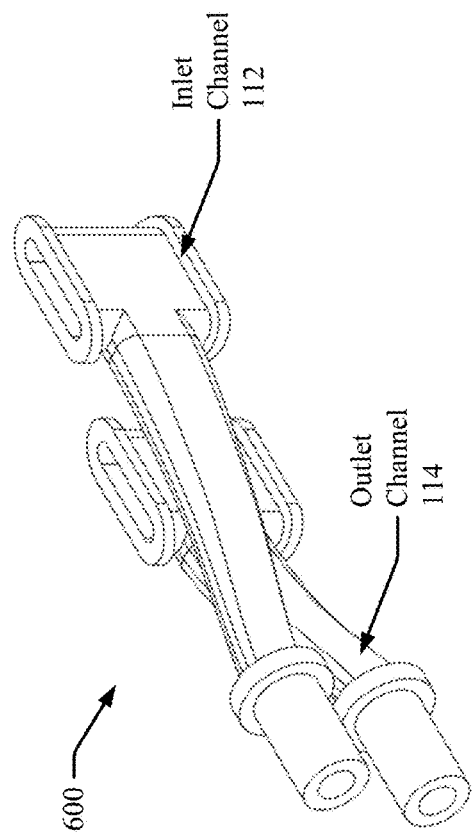
FIGS. 6A through 6D illustrate a perspective view, front view, side view, and cross-section view, respectively, of an exemplified inlet channel and an exemplified outlet channel in assembly positions.
Figure 6B:
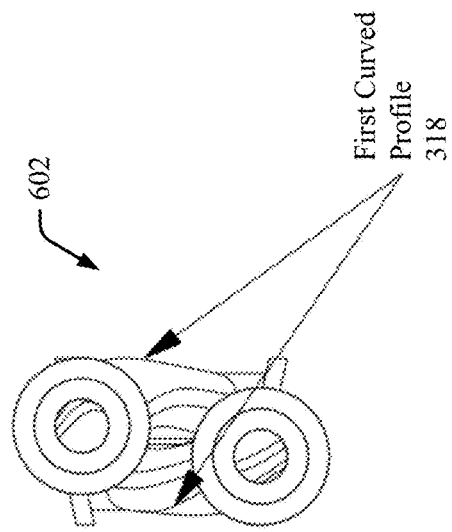
Figure 6C:
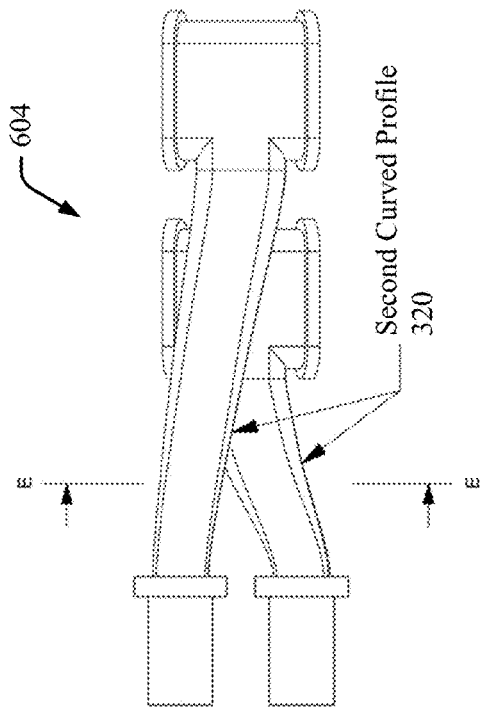
Figure 6D:
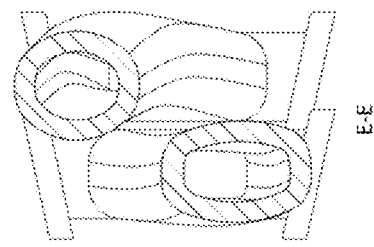

The perspective view 600 of FIG. 6A also illustrates that the length of the inlet channel 112 is longer than the length of the outlet channel 114. In other implementations, the inlet channel 112 may be shorter than the outlet channel 114. The difference in lengths facilitates the compact design of the heat exchanger 102 by staggering the longitudinal positions of the junction portions 312 for the outlet channel 114 and the inlet channel 112. This compact design allows a combined lateral profile of the junction portion 312 of the inlet channel 112 and the outlet channel 114 to be approximately equal to a lateral width of an individual junction portion 312.

In the depicted implementation, the second curved profile 320 of the inlet channel 112 is a bend down while the second curved profile 320 of the outlet channel 114 is a bend up along the longitudinal axis 302 from the connection portion 308 to the junction portion 312. In other implementations, the second curved profile 320 of the inlet channel 112 and the outlet channel 114 may be switched. The second curved profile 320 allows the connection portion 308 of the inlet channel 112 to be positioned above the connection portion 308 of the outlet channel 114, as illustrated in the front view 602 of FIG. 6B. In this way, the connection portions 308 use a limited lateral assembly space for the coolant hoses. In other implementations, the transfer portions 310 of the inlet channel 112 and the outlet channel 114 may include different curved profiles to provide a minimal vertical assembly space for the coolant hoses.

Figure 7:
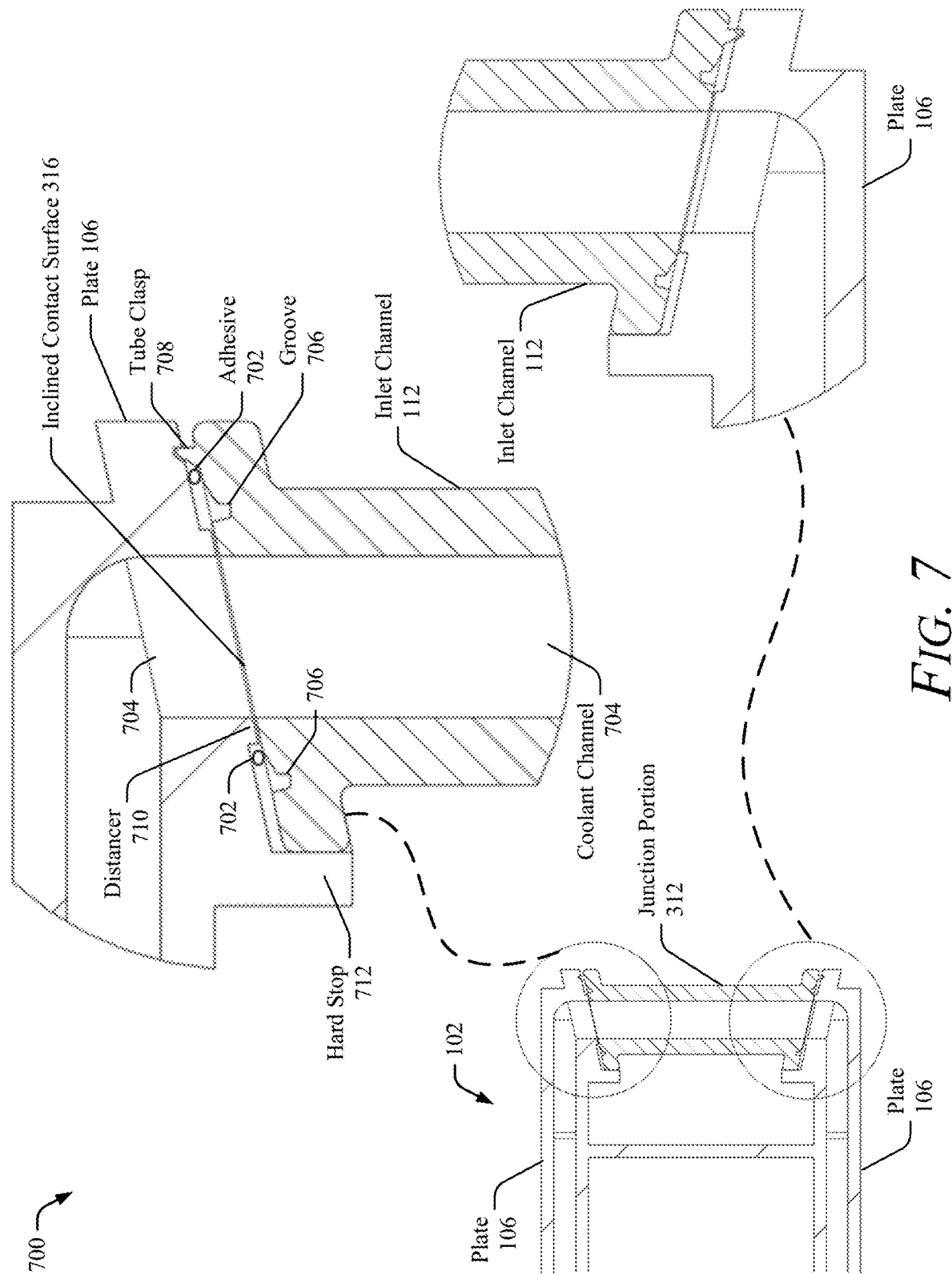
FIG. 7 illustrates a cross-section view of an exemplified heat exchanger with two plates and the junction portion of an exemplified inlet channel.

FIG. 7 illustrates a cross-section view 700 of an exemplified heat exchanger 102 with two plates 106 and the junction portion 312 of an exemplified inlet channel 112. The junction portion 312 of the outlet channel 114 has a similar cross-section with the same features as described with respect to the cross-section view 700.

The junction portion 312 may be joined to the plates 106 using an adhesive 702 on the inclined contact surfaces 316 of the inlet channel 112 (or the outlet channel 114). The adhesive 702 provides a tight and leakproof joint between the inlet channel 112 (or the outlet channel 114) and the plates 106. In addition, the adhesive 702 allows dissimilar materials (e.g., aluminum for the plates 106 and plastic for the inlet channel 112 and the outlet channel 114) to be joined. The adhesive 702 also compensates for geometrical inaccuracies (e.g., misalignments) in the assembly of the heat exchanger 102, which may result from manufacturing or assembly tolerances. For example, a thickness or viscosity of the adhesive 702 is configured to account for the manufacturing or assembly tolerances of the junction portion 312 and the plates 106, potentially resulting in cheaper manufacturing costs by lowering tolerances for the junction portion 312 and the plates 106.

As described with respect to FIGS. 3A through 3C and 4A through 4C, the junction portion 312 of the inlet channel 112 includes opposing inclined contact surfaces 316. The inclined contact surfaces 316 are inclined relative to a horizontal plane of the plates 106 and adapted to mate or abut corresponding inclined contact surfaces of the plates 106. The inclined contact surface 316 provides a simplified assembly process with a one-direction or single-motion connection. The inclined contact surface 316 of the junction portion 312 and the corresponding inclined contact surface of the plates 106 are designed to provide a controlled flow of the adhesive 702 during assembly and an appropriate gap or space for glue distribution. The inclined contact surface 316 and the plates 106 are also designed to facilitate correct positioning of the inlet channel 112 (or the outlet channel 114) and retention or clamping thereof Before assembly, the adhesive 702 may be applied to the inclined contact surface 316 of the junction portion 312 of the inlet channel 112 (or the outlet channel 114). The adhesive 702 is applied onto the inclined contact surface 316 near a groove 706. The shape of the groove 706 is designed to provide a recess in the inclined contact surface 316 and receive excess adhesive 702 during assembly. During the assembly, the distance between the inclined contact surfaces 316 is reduced and the adhesive 702 flows into the space between the plates 106 and the junction portion 312, partially defined by the groove 706. Distancers 710 on the plates 106 protrude from the inclined contact surface 316 adjacent to a coolant channel 704 that guides the coolant into or out of each plate 106. The distancers 710 prevent the adhesive 702 flowing out of the application area and the groove 706 into the coolant channel 704 during the assembly process. The distancers 710 also ensure a correct space or gap dimension between the junction portion 312 and the plates 106.

The plates 106 also include hard stops 712 to maintain a position of the junction portion 312 of the inlet channel 112 (or the outlet channel 114) during assembly and when attached to the heat exchanger 102. Together with the hard stops 712, tube clasps 708 provide a tight connection between the assembled components. The tube clasps 708 protrude from the inclined surfaces 316 of the junction portion 312 and are positioned at an opposite lateral end from the hard stops 712. The tube clasps 708 maintain a position of the junction portion 312 of the inlet channel 112 (or the outlet channel 114) when it is attached to the heat exchanger 102.

In other implementations, the heat exchanger 102 may use an elastic gasket or similar component in lieu of the adhesive 702. The elastic gasket fills the groove 706 and the gap in between the inclined contact surface 316 of the junction portion and the corresponding inclined contact surface of the plate 106 when the heat exchanger 102 is assembled. The junction portion 312 may be attached to the plates 106 and the heat exchanger 102 using a clasp on an exterior of the plate 106 or the inlet channel 112 (or the outlet channel 114).

Figure 8:
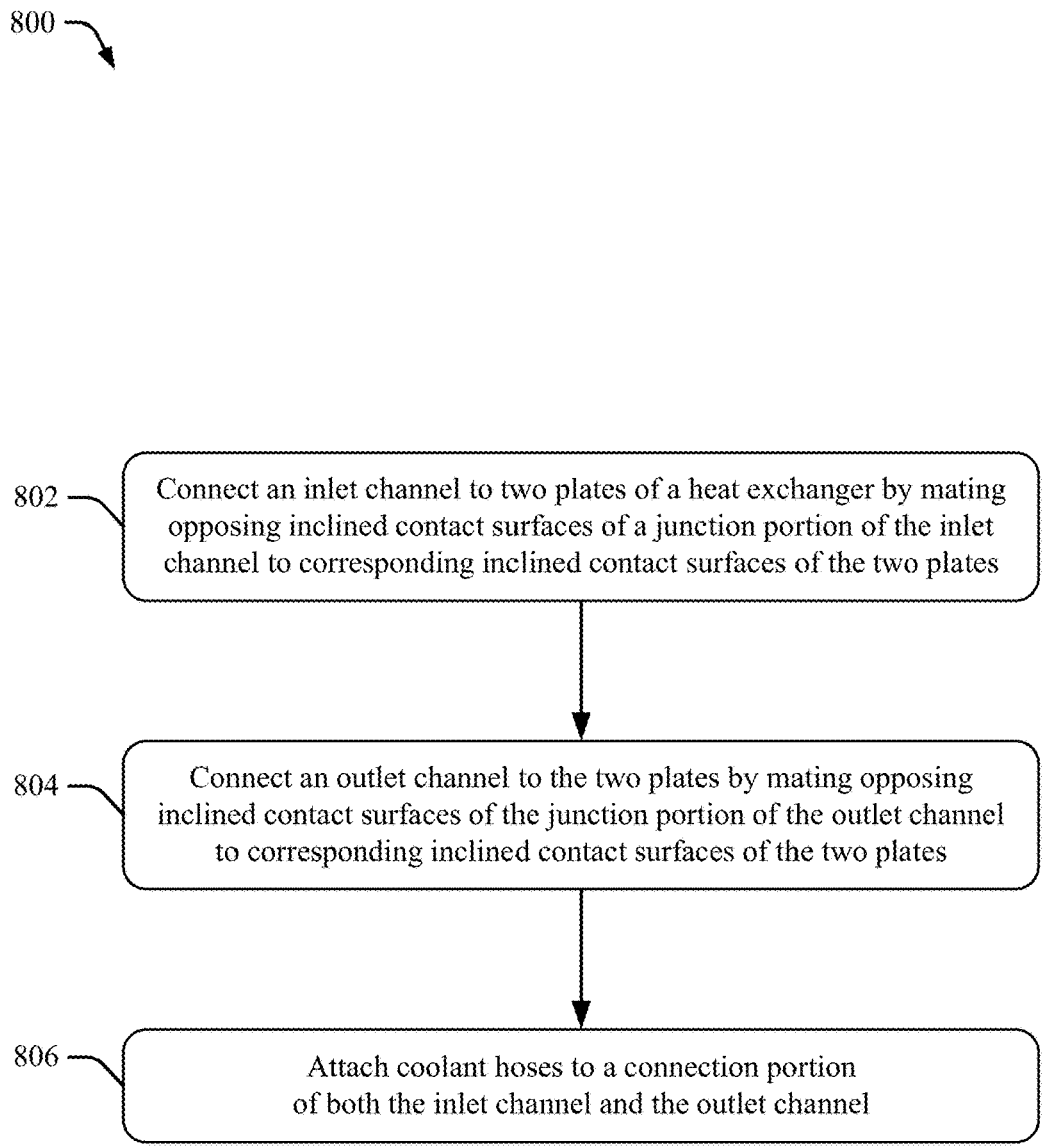
FIG. 8 illustrates an exemplified method for installing a manifold with an inlet channel and an outlet channel to a cooling system.

FIG. 8 illustrates an exemplified method 800 for installing a manifold with an inlet channel and an outlet channel to a cooling system in accordance with techniques of this disclosure. The cooling system may include a heat exchanger with two plates. Method 800 is shown as sets of operations (or acts) performed, but not necessarily limited to the order or combinations in which the operations are shown herein. Further, any one or more of the operations may be repeated, combined, or reorganized to provide other methods.

At step 802, the inlet channel 112 of a manifold is connected to the two plates 106 of the heat exchanger 102 by mating opposing inclined contact surfaces 316 of the junction portion 312 of the inlet channel 112 to corresponding inclined contact surfaces of the two plates 106. The inlet channel 112 guides coolant toward the two plates 106. The inclined contact surfaces 316 of the junction portion 312 are inclined relative to a horizontal plane of the two plates 106. The inlet channel 112 may be connected to the two plates 106 using the adhesive 702 or a combination of a gasket and exterior clasp.

At step 804, the outlet channel 114 of a manifold is connected to the two plates 106 of the heat exchanger 102 by mating opposing inclined contact surfaces 316 of the junction portion 312 of the outlet channel 114 to corresponding inclined contact surfaces of the two plates 106. The outlet channel 114 guides coolant away from the two plates 106. The inclined contact surfaces 316 of the junction portion 312 are inclined relative to a horizontal plane of the two plates 106. The outlet channel 114 may be connected to the two plates 106 using the adhesive 702 or a combination of a gasket and exterior clasp.

The inclined contact surfaces 316 of the junction portion 312 allow the inlet channel 112 and the outlet channel 114 to be inserted into position for assembly to the two plates 106 of the heat exchanger 102 along the longitudinal axis 302. In other words, the inlet channel 112 and the outlet channel 114 may be inserted in plane with the horizontal plane of the plates 106 from a front portion or side portion of a vehicle to accommodate tight spacing constraints.

At step 806, coolant hoses are attached to the connection portion 308 of both the inlet channel 112 and the outlet channel 114 of the manifold. The inlet channel 112 and the outlet channel 114 also include the transfer portion 310 between the junction portion 312 and the connection portion 308 that extends along the longitudinal axis 302. The longitudinal axis 302 is parallel with the horizontal plane of the two plates 106.

Additional Exemplified Embodiments

Some additional exemplified embodiments for inlet and outlet channels for a heat exchanger are provided below.

Exemplified Embodiment 1. A manifold for a cooling system, the manifold comprising: an inlet channel configured to connect to a heat exchanger of the cooling system that includes multiple plates, the inlet channel being configured to guide coolant toward the multiple plates of the heat exchanger; and an outlet channel configured to connect to the heat exchanger, the outlet channel being configured to guide the coolant away from the multiple plates of the heat exchanger, the inlet channel and the outlet channel including: a junction portion configured to transfer coolant to and from the multiple plates of the heat exchanger, the junction portion comprising opposing inclined contact surfaces that are inclined relative to a horizontal plane of the multiple plates and configured to mate with corresponding inclined contact surfaces of the multiple plates; a connection portion configured to accept a coolant hose; and a transfer portion between the junction portion and the connection portion, the transfer portion extending along a longitudinal axis.

Exemplified Embodiment 2. The manifold of Exemplified Embodiment 1, wherein the transfer portion of the inlet channel and the outlet channel has a non-uniform cross-section along the longitudinal axis that transitions from a first cross-section proximate the connection portion to a second cross-section proximate the junction portion.

Exemplified Embodiment 3. The manifold of Exemplified Embodiment 1 or 2, wherein the connection portion of the inlet channel and the outlet channel includes an external stop feature to stop the coolant hose from extending into the transfer portion.

Exemplified Embodiment 4. The manifold of any previous Exemplified Embodiment, wherein the inlet channel and outlet channel are plastic or reinforced plastic.

Exemplified Embodiment 5. The manifold of any previous Exemplified Embodiment, wherein the inclined contact surfaces of the junction portion are configured to allow the inlet channel and the outlet channel to be assembled to the multiple plates of the heat exchanger along the longitudinal axis of the transfer portion.

Exemplified Embodiment 6. The manifold of any previous Exemplified Embodiment, wherein the junction portion of the inlet channel and the outlet channel is configured to attach to the multiple plates of the heat exchanger using an adhesive on the inclined contact surfaces of the inlet channel and the outlet channel.

Exemplified Embodiment 7. The manifold of Exemplified Embodiment 6, wherein the inclined contact surfaces of the junction portion include a groove, the groove forming a recess in the inclined contact surfaces of the junction portion and being configured to receive excess adhesive.

Exemplified Embodiment 8. The manifold of any previous Exemplified Embodiment, wherein the inclined contact surfaces of the junction portion include a tube clasp located at a lateral end of the inclined contact surfaces, the tube clasp being configured to maintain a position of the junction portion of the inlet channel and the outlet channel when the junction portion is attached to the heat exchanger.

Exemplified Embodiment 9. The manifold of any one of Exemplified Embodiment 1 through 5 or 8, wherein the inclined contact surfaces of the junction portion include a groove, the groove forming a recess in the inclined contact surfaces and being configured to allow an elastic gasket to fill a space in between the inclined contact surfaces of the junction portion and the corresponding inclined contact surfaces of the multiple plates when the junction portion is attached to the heat exchanger.

Exemplified Embodiment 10. The manifold of Exemplified Embodiment 9, wherein the junction portion is configured to attach to the heat exchanger using an external clasp.

Exemplified Embodiment 11. The manifold of any previous Exemplified Embodiment, wherein the transfer portion of the inlet channel and the outlet channel include a first curved profile along a first plane defined by the longitudinal axis and a lateral axis, the lateral axis being orthogonal to the longitudinal axis, the first curved profile resulting in a left curve or right curve as the inlet channel and the outlet channel transition from the junction portion to the connection portion, the first curved profile of the inlet channel being in a direction opposite that of the first curved profile of the outlet channel.

Exemplified Embodiment 12. The manifold of Exemplified Embodiment 11, wherein the transfer portion of the inlet channel and the outlet channel include a second curved profile along a second plane defined by the longitudinal axis and a vertical axis, the second plane being orthogonal to the first plane, the second curved profile resulting in an upward curve or downward curve as the inlet channel and the outlet channel transition from the junction portion to the connection portion, the second curved profile of the inlet channel being in another direction opposite that of the second curved profile of the outlet channel.

Exemplified Embodiment 13. The manifold of Exemplified Embodiment 12, wherein a length of the inlet channel is different than a length of the outlet channel.

Exemplified Embodiment 14. The manifold of Exemplified Embodiment 13, wherein: the connection portion of the inlet channel is positioned at approximately a same lateral position along the lateral axis as the connection portion of the outlet channel; and the connection portion of the inlet channel is positioned above or below the connection portion of the outlet channel along the vertical axis.

Exemplified Embodiment 15. The manifold of Exemplified Embodiment 14, wherein a combined lateral profile of the connection portion of both the inlet channel and the outlet channel along the lateral axis is approximately equal to a diameter of the connection portion.

Exemplified Embodiment 16. A cooling system comprising: a heat exchanger comprising at least one plate configured to transfer heat away from electronic components, each plate of the heat exchanger comprising a first inclined contact surface that is inclined relative to a horizontal plane of each plate; and a manifold comprising: an inlet channel configured to connect to the at least one plate of the heat exchanger and guide coolant toward each plate of the heat exchanger; and an outlet channel configured to connect to the at least one plate of the heat exchanger and guide the coolant away from each plate of the heat exchanger, the inlet channel and the outlet channel including: a junction portion configured to transfer coolant to and from each plate of the heat exchanger, the junction portion comprising second inclined contact surfaces that are inclined relative to the horizontal plane of each plate and configured to mate with the corresponding first inclined contact surfaces of each plate; a connection portion configured to accept a coolant hose; and a transfer portion between the junction portion and the connection portion, the transfer portion extending along a longitudinal axis.

Exemplified Embodiment 17. The cooling system of Exemplified Embodiment 16, wherein the heat exchanger is made of a first material and the manifold is made of a second material that is different than the first material.

Exemplified Embodiment 18. The cooling system of Exemplified Embodiment 16 or 17, wherein: the second inclined contact surfaces of the junction portion include a groove, the groove forming a recess in the second inclined contact surfaces of the junction portion and being configured to receive excess adhesive; the first inclined contact surface of each plate of the heat exchanger includes distancers positioned in between the groove of the junction portion and a coolant channel of each plate when the junction portion is attached to the heat exchanger, the distancers configured to prevent the adhesive from entering the coolant channel that guides the coolant into or out of each plate; and each plate of the heat exchanger includes a hard stop configured to maintain a position of the junction portion of the inlet channel and the outlet channel when the junction portion is attached to the heat exchanger.

Exemplified Embodiment 19. The cooling system of any one of Exemplified Embodiment 16 through 18, wherein the cooling system is configured to be installed in a vehicle.

Exemplified Embodiment 20. A method of installing a manifold to a cooling system, the cooling system comprising a heat exchanger with two plates, the method comprising: connecting an inlet channel of the manifold to the two plates of the heat exchanger by mating opposing inclined contact surfaces of a junction portion of the inlet channel to corresponding inclined contact surfaces of the two plates, the inlet channel being configured to guide coolant toward the two plates, the opposing inclined contact surfaces of the junction portion being inclined relative to a horizontal plane of the two plates; connecting an outlet channel of the manifold to the two plates of the heat exchanger by mating the opposing inclined contact surfaces of the junction portion of the outlet channel to corresponding inclined contact surfaces of the two plates, the outlet channel being configured to guide the coolant away from the two plates; and attaching coolant hoses to a connection portion of both the inlet channel and the outlet channel of the manifold, the inlet channel and the outlet channel further including a transfer portion between the junction portion and the connection portion that extends along a longitudinal axis, the longitudinal axis being parallel with the horizontal plane of the two plates.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the scope of the disclosure as defined by the following claims.

What is claimed is:

1. A manifold for a cooling system, the manifold comprising:
    an inlet channel configured to connect to a heat exchanger of the cooling system that includes multiple plates, the inlet channel being configured to guide coolant toward the multiple plates of the heat exchanger; and
    an outlet channel configured to connect to the heat exchanger, the outlet channel being configured to guide the coolant away from the multiple plates of the heat exchanger,
    the inlet channel and the outlet channel including:
        a junction portion configured to transfer coolant to and from the multiple plates of the heat exchanger, the junction portion comprising opposing inclined contact surfaces that are inclined relative to a horizontal plane of the multiple plates and configured to mate with corresponding inclined contact surfaces of the multiple plates;
        a connection portion configured to accept a coolant hose; and
        a transfer portion between the junction portion and the connection portion, the transfer portion extending along a longitudinal axis.

2. The manifold of claim 1, wherein the transfer portion of the inlet channel and the outlet channel has a non-uniform cross-section along the longitudinal axis that transitions from a first cross-section proximate the connection portion to a second cross-section proximate the junction portion.

3. The manifold of claim 1, wherein the connection portion of the inlet channel and the outlet channel includes an external stop feature to stop the coolant hose from extending into the transfer portion.

4. The manifold of claim 1, wherein the inlet channel and outlet channel are plastic or reinforced plastic.

5. The manifold of claim 1, wherein the inclined contact surfaces of the junction portion are configured to allow the inlet channel and the outlet channel to be assembled to the multiple plates of the heat exchanger along the longitudinal axis of the transfer portion.

6. The manifold of claim 1, wherein the junction portion of the inlet channel and the outlet channel is configured to attach to the multiple plates of the heat exchanger using an adhesive on the inclined contact surfaces of the inlet channel and the outlet channel.

7. The manifold of claim 6, wherein the inclined contact surfaces of the junction portion include a groove, the groove forming a recess in the inclined contact surfaces of the junction portion and being configured to receive excess adhesive.

8. The manifold of claim 1, wherein the inclined contact surfaces of the junction portion include a tube clasp located at a lateral end of the inclined contact surfaces, the tube clasp being configured to maintain a position of the junction portion of the inlet channel and the outlet channel when the junction portion is attached to the heat exchanger.

9. The manifold of claim 1, wherein the inclined contact surfaces of the junction portion include a groove, the groove forming a recess in the inclined contact surfaces and being configured to allow an elastic gasket to fill a space in between the inclined contact surfaces of the junction portion and the corresponding inclined contact surfaces of the multiple plates when the junction portion is attached to the heat exchanger.

10. The manifold of claim 9, wherein the junction portion is configured to attach to the heat exchanger using an external clasp.

11. The manifold of claim 1, wherein the transfer portion of the inlet channel and the outlet channel include a first curved profile along a first plane defined by the longitudinal axis and a lateral axis, the lateral axis being orthogonal to the longitudinal axis, the first curved profile resulting in a left curve or right curve as the inlet channel and the outlet channel transition from the junction portion to the connection portion, the first curved profile of the inlet channel being in a direction opposite that of the first curved profile of the outlet channel.

12. The manifold of claim 11, wherein the transfer portion of the inlet channel and the outlet channel include a second curved profile along a second plane defined by the longitudinal axis and a vertical axis, the second plane being orthogonal to the first plane, the second curved profile resulting in an upward curve or downward curve as the inlet channel and the outlet channel transition from the junction portion to the connection portion, the second curved profile of the inlet channel being in another direction opposite that of the second curved profile of the outlet channel.

13. The manifold of claim 12, wherein a length of the inlet channel is different than a length of the outlet channel.

14. The manifold of claim 13, wherein:
the connection portion of the inlet channel is positioned at approximately a same lateral position along the lateral axis as the connection portion of the outlet channel; and
the connection portion of the inlet channel is positioned above or below the connection portion of the outlet channel along the vertical axis.

15. The manifold of claim 14, wherein a combined lateral profile of the connection portion of both the inlet channel and the outlet channel along the lateral axis is approximately equal to a diameter of the connection portion.

16. A cooling system comprising:
a heat exchanger comprising at least one plate configured to transfer heat away from electronic components, each plate of the heat exchanger comprising a first inclined contact surface that is inclined relative to a horizontal plane of each plate; and
a manifold comprising:
an inlet channel configured to connect to the at least one plate of the heat exchanger and guide coolant toward each plate of the heat exchanger; and
an outlet channel configured to connect to the at least one plate of the heat exchanger and guide the coolant away from each plate of the heat exchanger,
the inlet channel and the outlet channel including:
a junction portion configured to transfer coolant to and from each plate of the heat exchanger, the junction portion comprising second inclined contact surfaces that are inclined relative to the horizontal plane of each plate and configured to mate with the corresponding first inclined contact surfaces of each plate;
a connection portion configured to accept a coolant hose; and
a transfer portion between the junction portion and the connection portion, the transfer portion extending along a longitudinal axis.

17. The cooling system of claim 16, wherein the heat exchanger is made of a first material and the manifold is made of a second material that is different than the first material.

18. The cooling system of claim 16, wherein:
the second inclined contact surfaces of the junction portion include a groove, the groove forming a recess in the second inclined contact surfaces of the junction portion and being configured to receive excess adhesive;
the first inclined contact surface of each plate of the heat exchanger includes distancers positioned in between the groove of the junction portion and a coolant channel of each plate when the junction portion is attached to the heat exchanger, the distancers configured to prevent the adhesive from entering the coolant channel that guides the coolant into or out of each plate; and
each plate of the heat exchanger includes a hard stop configured to maintain a position of the junction portion of the inlet channel and the outlet channel when the junction portion is attached to the heat exchanger.

19. The cooling system of claim 16, wherein the cooling system is configured to be installed in a vehicle.

20. A method of installing a manifold to a cooling system, the cooling system comprising a heat exchanger with two plates, the method comprising:
connecting an inlet channel of the manifold to the two plates of the heat exchanger by mating opposing inclined contact surfaces of a junction portion of the inlet channel to corresponding inclined contact surfaces of the two plates, the inlet channel being configured to guide coolant toward the two plates, the opposing inclined contact surfaces of the junction portion being inclined relative to a horizontal plane of the two plates;
connecting an outlet channel of the manifold to the two plates of the heat exchanger by mating the opposing inclined contact surfaces of the junction portion of the outlet channel to corresponding inclined contact surfaces of the two plates, the outlet channel being configured to guide the coolant away from the two plates; and
attaching coolant hoses to a connection portion of both the inlet channel and the outlet channel of the manifold, the inlet channel and the outlet channel further including a transfer portion between the junction portion and the connection portion that extends along a longitudinal axis, the longitudinal axis being parallel with the horizontal plane of the two plates.

* * * * *